(12) United States Patent
Chen et al.

(10) Patent No.: US 10,991,693 B2
(45) Date of Patent: Apr. 27, 2021

(54) BOUNDARY REGION FOR HIGH-K-METAL-GATE (HKMG) INTEGRATION TECHNOLOGY

(71) Applicant: Taiwan Semiconductor Manufacturing Co., Ltd., Hsin-Chu (TW)

(72) Inventors: Yi-Huan Chen, Hsin Chu (TW); Chien-Chih Chou, New Taipei (TW); Kong-Beng Thei, Pao-Shan Village (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/732,450

(22) Filed: Jan. 2, 2020

(65) Prior Publication Data
US 2020/0144263 A1 May 7, 2020

Related U.S. Application Data

(63) Continuation of application No. 15/688,276, filed on Aug. 28, 2017, now Pat. No. 10,553,583.

(51) Int. Cl.
*H01L 27/092* (2006.01)
*H01L 29/10* (2006.01)
(Continued)

(52) U.S. Cl.
CPC .. *H01L 27/0922* (2013.01); *H01L 21/823842* (2013.01); *H01L 29/1054* (2013.01);
(Continued)

(58) Field of Classification Search
CPC ............... H01L 21/84; H01L 29/66833; H01L 27/0629; H01L 27/0922; H01L 21/823821
See application file for complete search history.

(56) References Cited

U.S. PATENT DOCUMENTS 6,281,050 B1    8/2001  Sakagami
10,553,583 B2 *  2/2020  Chen ................. H01L 29/66545
(Continued)

OTHER PUBLICATIONS

Non-Final Office Action dated Dec. 28, 2018 for U.S. Appl. No. 15/688,276.
(Continued)

*Primary Examiner* — Changhyun Yi
(74) *Attorney, Agent, or Firm* — Eschweiler & Potashnik, LLC

(57) ABSTRACT

The present disclosure relates to an integrated circuit (IC) that includes a boundary region defined between a low voltage region, and a method of formation. In some embodiments, the integrated circuit comprises a first gate boundary dielectric layer disposed over a substrate in the low voltage region. A second gate boundary dielectric layer is disposed over the substrate in the high voltage region having a thickness greater than that of the first boundary dielectric layer. The first boundary dielectric layer meets the second boundary dielectric layer at the boundary region. A first polysilicon component is disposed within the boundary region over the first boundary dielectric layer and the second gate boundary layer. A second polysilicon component is disposed within the boundary region over the first polysilicon component. A hard mask component is disposed over the first polysilicon component and laterally neighbored to the second polysilicon component.

20 Claims, 9 Drawing Sheets

(51) Int. Cl.
    *H01L 29/66*     (2006.01)
    *H01L 21/8238*     (2006.01)
    *H01L 21/84*     (2006.01)
    *H01L 29/06*     (2006.01)
    *H01L 29/423*     (2006.01)

(52) U.S. Cl.
    CPC ...... *H01L 29/66545* (2013.01); *H01L 21/845* (2013.01); *H01L 29/0653* (2013.01); *H01L 29/42364* (2013.01)

(56) References Cited

U.S. PATENT DOCUMENTS

| | | |
|---|---|---|
| 2005/0133874 A1 | 6/2005 | Goda et al. |
| 2006/0019446 A1 | 1/2006 | Yang |
| 2010/0096262 A1 | 4/2010 | Aruga et al. |
| 2013/0234244 A1 | 9/2013 | Liu et al. |
| 2014/0225176 A1 | 8/2014 | Cheek et al. |
| 2015/0145073 A1* | 5/2015 | Lee .................. H01L 29/6656 257/411 |
| 2016/0358919 A1 | 12/2016 | Chen et al. |
| 2017/0133394 A1 | 5/2017 | Ogata |
| 2018/0269115 A1* | 9/2018 | Julien ................ H01L 27/1207 |

OTHER PUBLICATIONS

Final Office Action dated Sep. 12, 2019 for U.S. Appl. No. 15/688,276.
Non-Final Office Action dated Apr. 26, 2019 for U.S. Appl. No. 15/688,276.
Notice of Allowance dated Nov. 19, 2019 for U.S. Appl. No. 15/688,276.

* cited by examiner

BOUNDARY REGION FOR HIGH-K-METAL-GATE (HKMG) INTEGRATION TECHNOLOGY

REFERENCE TO RELATED APPLICATION

This application is a Continuation of U.S. application Ser. No. 15/688,276, filed on Aug. 28, 2017, the contents of which are hereby incorporated by reference in their entirety.

BACKGROUND

The semiconductor integrated circuit (IC) industry has experienced exponential growth over the last few decades. In the course of IC evolution, high voltage technology has been widely used in power management, regulator, battery protector, DC motor, automotive relative, panel display driver (STN, TFT, OLED, etc.), color display driver, power supply relative, telecom, etc. On the other hand, functional density (i.e., the number of interconnected devices per chip area) has generally increased while geometry size (i.e., the smallest component (or line) that can be created using a fabrication process) has decreased. One advancement implemented as technology nodes shrink, in some IC designs, has been the replacement of the typically polysilicon gate electrode with a metal gate electrode to improve device performance with the decreased feature sizes. Semiconductor devices of the replacement gate technology are integrated on the same chip with a logic core, and support the logic core to accomplish an intended function and limits or eliminate inter-chip communication. However, there are challenges to embed low voltage devices and high voltage devices especially on 28 nm node and beyond process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
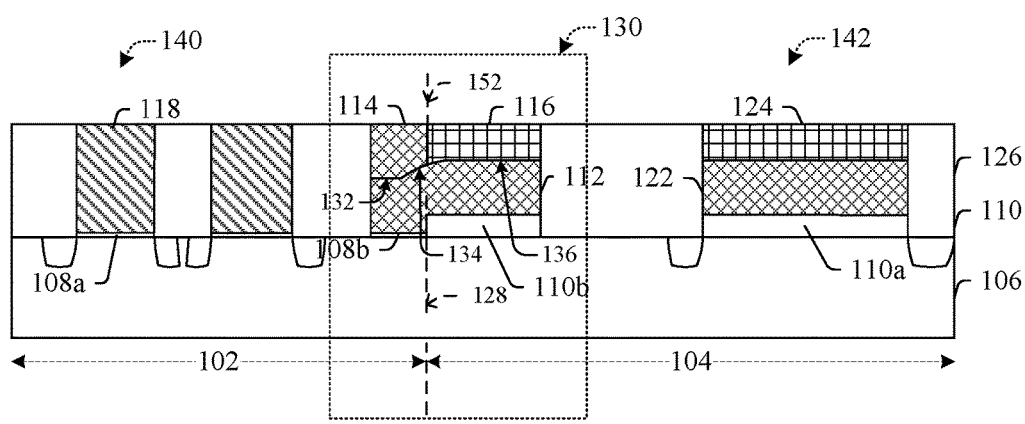
FIG. 1 illustrates a cross-sectional view of some embodiments of an integrated circuit (IC) comprising a boundary region defined between a low voltage region and a high voltage region.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

High-k metal gate (HKMG) technology has become one of the front-runners for the next generation of CMOS devices. HKMG technology incorporates a high-k dielectric to increase transistor capacitance and reduce gate leakage. A metal gate electrode is used to help with Fermi-level pinning and to allow the gate to be adjusted to low threshold voltages. By combining the metal gate electrode and the high-k dielectric, HKMG technology makes further scaling possible and allows integrated chips to function with reduced power. HKMG technology can be used for memory devices, display devices, sensor devices, among other applications where a high voltage region is needed and incorporated in the integrated circuits to provide higher power and have higher breakdown voltage than conventional MOS devices. A problem associated with such integrated circuits, is boundary defects between the high voltage region and the device region operated in normal voltage (referred as a low voltage region below). For example, the gate dielectrics for the high voltage region and the low voltage region often require different thickness and thus may need to be processed separately. Comparatively high isolation damage can be introduced due to gate dielectrics' patterning and removal. In addition, the boundary region between the high voltage region and the low voltage region may lack structure supports, and a dishing effect introduced by planarization processes may result in uneven surfaces and affect device performance in low voltage region and/or high voltage region.

The present disclosure relates to an integrated circuit (IC) that comprises a boundary structure of a boundary region between a low voltage region and a high voltage region, and a method of formation therefor. In some embodiments, referring to FIG. 1 for example, an integrated circuit 100 comprises a low voltage region 102, a high voltage region 104, and a boundary region 130 defined between the low voltage region 102 and the high voltage region 104. The boundary region 130 comprises a boundary structure including a first polysilicon component 112 disposed over a first boundary dielectric layer 108b in the low voltage region 102 and a second boundary dielectric layer 110b in the high voltage region 104, a second polysilicon component 114 over a portion of the first polysilicon component 112, and a hard mask component 116 over an adjacent portion of the first polysilicon component 112 and laterally neighbored to the second polysilicon component 114. By forming the boundary structure within the boundary region as introduced above, isolation damages due to gate dielectrics' patterning and removal can be reduced or even eliminated since portions of precursor layers are protected within the boundary region from removal during the patterning processes. For example, the first boundary dielectric layer 108b and the second boundary dielectric layer 110b are formed when patterning precursor dielectric layers for forming gate dielectrics within the low voltage region 102 and the high voltage region 104. Also, the disclosed boundary structure provides supports during fabrications, such that the dishing effect is reduced or eliminated. Thereby, device performance is improved and manufacturing process is simplified, such that further scaling becomes possible in emerging technology nodes.

FIG. 1 illustrates a cross-sectional view of some embodiments of an integrated circuit comprising a boundary region defined between a low voltage region and a high voltage region. As shown in FIG. 1, an integrated circuit 100 is disposed over a substrate 106, and includes a low voltage region 102, a high voltage region 104, and a boundary region 130 defined between the low voltage region 102 and the high voltage region 104. In some embodiments, a first transistor device 140 is disposed within the low voltage region 102. The first transistor device 140 has a first gate electrode 118 disposed over a first gate dielectric layer 108a between a pair of source/drain regions. In some embodiments, the first gate electrode 118 comprises polysilicon. In some other embodiments, the first gate electrode 118 may be made of metal or metal alloy material. A second transistor device 142 is disposed within the high voltage region 104. The second transistor device 142 has a second gate electrode 122 disposed over the second gate dielectric layer 110a between a pair of source/drain regions. The second transistor device 142 is configured to operate at an operation voltage greater than that of the first transistor device 140. In some embodiments, the second gate electrode 122 comprises polysilicon. In some other embodiments, the second gate electrode 122 may be made of metal or metal alloy material.

Within the boundary region 130, a first boundary dielectric layer 108b is disposed over the substrate 106 within the low voltage region 102, and a second boundary dielectric layer 110b is disposed over the substrate 106 within the high voltage region 104. The first boundary dielectric layer 108b and the second boundary dielectric layer 110b may contact each other and meet at an interface 128 within the boundary region 130. The first gate dielectric layer 108a and the first boundary dielectric layer 108b may have the same composition and thickness. The second gate dielectric layer 110a and the second boundary dielectric layer 110b may have the same composition and thickness. The first boundary dielectric layer 108b and the second boundary dielectric layer 110b may be disposed directly on the substrate 106. The first boundary dielectric layer 108b and the second boundary dielectric layer 110b may have same or different compositions. In some embodiments, the first boundary dielectric layer 108b and the second boundary dielectric layer 110b can comprise oxide material, such as silicon dioxide. The second boundary dielectric layer 110b can have a thickness greater than that of the first boundary dielectric layer 108b. In some embodiments, the thickness of the second boundary dielectric layer 110b is about 2 to 5 times of a thickness of the first boundary dielectric layer 108b, such that the second boundary dielectric layer 110b may support a greater break down voltage. For example, the first boundary dielectric layer 108b can have a thickness in a range of from about 30 angstroms (Å) to about 100 Å, while the second boundary dielectric layer 110b can have a thickness in a range of from about 150 Å to about 400 Å. As can be appreciated, theses dimensions, and other dimensions discussed herein can be scaled for different process nodes.

Still within the boundary region 130, a first polysilicon component 112 is disposed over the first boundary dielectric layer 108b and the second boundary dielectric layer 110b. The first polysilicon component 112 may have a continuous top surface crossing over an extending line of the interface 128. In some embodiments, the top surface of the first polysilicon component 112 may comprise a first planar portion 132 and a second planar portion 136 connected by a convex portion 134. The first planar portion 132 is within the low voltage region 102, and the second planar portion 136 is within the high voltage region 104. In the illustrated embodiment, the first planar portion 132 is positioned lower than the second planar portion 136 relative to the substrate 106. In some embodiments, the first planar portion 132 and the second planar portion 136 may have the substantially same lateral width. In some alternative embodiments, the first planar portion 132 may have a lateral width smaller than that of the second planar portion 136. In some further embodiments, the first planar portion 132 may have a lateral width greater than that of the second planar portion 136. A second polysilicon component 114 is disposed over the first polysilicon component 112. A hard mask component 116 is disposed over the first polysilicon component 112 and laterally neighbored to the second polysilicon component 114. The second polysilicon component 114 can be disposed at one side of the low voltage region 102. The hard mask component 116 can be disposed at an opposite side of the high voltage region 104. The second polysilicon component 114 may have a thickness equal to that of the first polysilicon component 112. The thickness of the second polysilicon component 114 may also be greater or smaller than that of the first polysilicon component 112.

The second polysilicon component 114 and the hard mask component 116 meet at an interface 152. In some embodiments, the interface 152 can be an extending line of the interface 128, while the interface 152 can be laterally shifted from an extending line of the interface 128 in some other embodiments. The interface 152 may be substantially vertical to an upper surface of the substrate 106. The first polysilicon component 112 and the second polysilicon component 114 may have aligned outer sidewalls. The first polysilicon component 112 and the hard mask component 116 may have aligned outer sidewalls. The second polysilicon component 114 and the hard mask component 116 may have alighted top surfaces.

In some embodiments, the first gate electrode 118 may have a thickness substantially equal to a collective thickness of the first polysilicon component 112 and the second polysilicon component 114. The first gate electrode 118 and the second polysilicon component 114 may have aligned top surfaces. The second gate electrode 122 may have a thickness equal to that of the first polysilicon component 112. A top surface of the second gate electrode 122 may be aligned with the second planar portion 136 of the top surface of the first polysilicon component 112. In some embodiments, a hard mask 124 is disposed over the second gate electrode 122 within the high voltage region 104. The hard mask 124 has the same composition as the hard mask component 116 within the boundary region 130. The hard mask 124 and the hard mask component 116 may have the substantially equal thickness. The hard mask 124 and the hard mask component 116 may also have aligned top surfaces.

Figure 2:
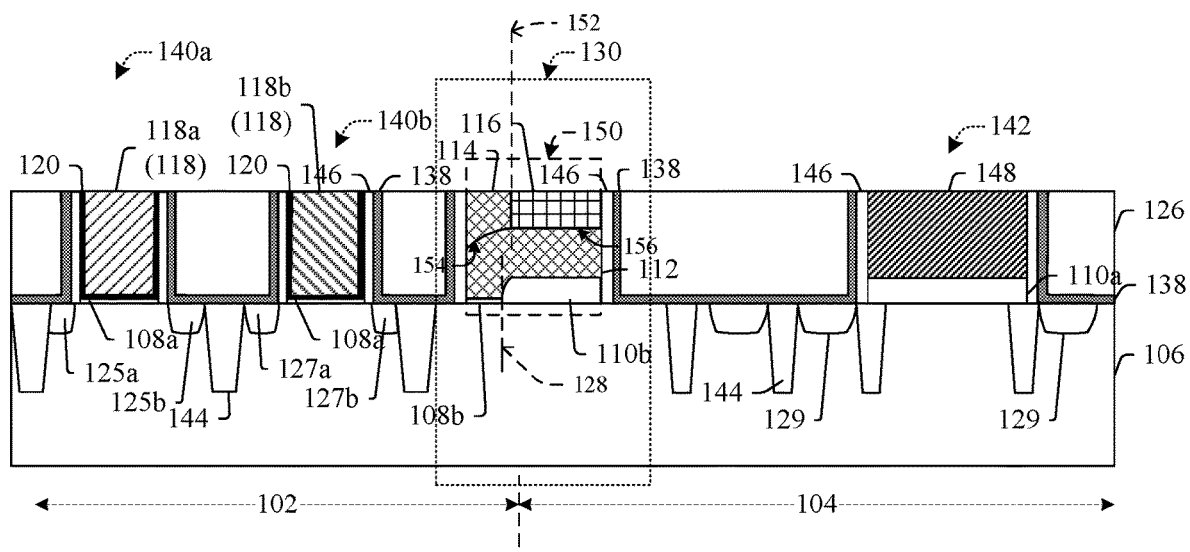
FIG. 2 illustrates a cross-sectional view of some additional embodiments of an IC comprising a boundary region defined between a low voltage region and a high voltage region.

FIG. 2 illustrates a cross-sectional view of some additional embodiments of an integrated circuit comprising a boundary region defined between a low voltage region and a high voltage region.

As shown in FIG. 2, an integrated circuit 200 is disposed over a substrate 106, and includes a low voltage region 102 and a high voltage region 104. A boundary region 130 is defined between the low voltage region 102 and the high voltage region 104. The low voltage region 102 comprises a first transistor device 140 having a first gate electrode 118 disposed over a first gate dielectric layer 108a. The first transistor device 140 can be a NMOS transistor 140a comprising a NMOS gate electrode 118a or a PMOS transistor 140b comprising a PMOS gate electrode 118b. The NMOS gate electrode 118a is disposed between two source/drain regions 125a, 125b; and the PMOS gate electrode 118b is disposed between two source/drain regions 127a, 127b having an opposite doping type from the source/drain regions 125a, 125b. The first gate electrode 118 has its bottom and sidewall surfaces covered by a high-k gate dielectric layer 120 and are disposed over the first gate dielectric layer 108a. By making use of HKMG structure in transistors of the low voltage region 102, transistor capacitance (and thereby drive current) is increased and gate leakage and threshold voltage are reduced. In some embodiments, the first gate electrode 118 comprises polysilicon. In some alternative embodiments, the first gate electrode 118 comprises a core metal layer separated from the high-k gate dielectric layer 120 by a barrier layer. The barrier layer protects the core metal layer from diffusing into surrounding materials. In some embodiments, the core metal layer comprises copper (Cu), tungsten (W) or aluminum (Al), or their alloys, for example; and the barrier layer can comprise metal materials such as titanium (Ti), tantalum (Ta), zirconium (Zr), or their alloys, for example. In some embodiments, the high-k gate dielectric layer 120 comprises hafnium oxide (HfO), hafnium silicon oxide (HfSiO), hafnium aluminum oxide (HfAlO), or hafnium tantalum oxide (HMO), for example. In some embodiments, to alter the work functions of the NMOS gate electrode 118a and the PMOS gate electrode 118b, the PMOS gate electrode 118b is made of a different metal than the NMOS gate electrode 118a. The PMOS gate electrode 118b can also have a different thickness from the NMOS gate electrode 118a. In some embodiments, the barrier layer can be the same material and/or thickness for the PMOS gate electrode 118b as for the NMOS gate electrode 118a. Though not shown in FIG. 2, in some embodiments, the low voltage region 102 may comprise memory devices. For example, first and second memory cells can be disposed having a pair of control gate electrodes separated from the substrate 106 by corresponding floating gates. A pair of select gate electrodes can be disposed at opposite sides of the pair of control gate electrodes and separated from the substrate 106 by a select gate dielectric. Thus, a control gate electrode and one of the select gate electrodes establish a first control gate/select gate pair; while the other control gate electrode and corresponding select gate electrode establish a second control gate/select gate pair. The first control gate/select gate pair and the second control gate/select gate pair share a common source/drain region disposed therebetween. The floating gates are disposed on a floating gate dielectric and have upper surfaces covered by an inter-poly dielectric.

The high voltage region 104 comprises a second transistor device 142 having a second gate electrode 148 disposed over a second gate dielectric layer 110a. The second gate dielectric layer 110a has a thickness greater than that of the first gate dielectric layer 108a. The second transistor device 142 is configured to operate at an operation voltage greater than that of the first transistor device 140. The second gate electrode 148 may have a gate length and a gate width greater than that of the first gate electrode 118. In some embodiments, the second gate electrode 148 may comprise polysilicon material. In some alternative embodiments, the second gate electrode 148 comprises metal or metal alloy. The second gate electrode 148 may comprise a core metal layer separated from the high-k gate dielectric layer by a barrier layer (not shown in the figure). The second transistor can be a driver transistor, a power transistor, among applications. The second transistor can be a LDMOS (laterally diffused metal oxide semiconductor) transistor designed for low on-resistance and high blocking voltage. Source/drain regions 129 are disposed alongside the second gate electrode 148 and may be asymmetrical. Isolation regions 144 (such as a shallow trench isolation (STI) structure or a deep trench isolation (DTI) structure) are disposed under and aside from the second gate electrode 148 within the substrate 106. In some embodiments, a sidewall spacer 146 can be disposed along sidewalls of the first gate electrodes 118 and the second gate electrode 148. In some embodiments, the sidewall spacer 146 may comprise one or more layers of oxide or nitride.

The boundary region 130 comprises a first polysilicon component 112 over the substrate 106, a second polysilicon component 114 disposed over the first polysilicon component 112, and a hard mask component 116 also disposed over the first polysilicon component 112 neighboring to the second polysilicon component 114. In some embodiments, the first polysilicon component 112 is disposed directly on a first boundary dielectric layer 108b and a second boundary dielectric layer 110b. The first boundary dielectric layer 108b is spaced apart from the first gate dielectric layer 108a which is disposed directly under the first gate electrode 118. The second boundary dielectric layer 110b is spaced apart from the second gate dielectric layer 110a which is disposed directly under the second gate electrode 148. The sidewall spacer 146 also have a portion disposed within the boundary region 130 alongside the first polysilicon component 112 the second polysilicon component 114, and the hard mask component 116. A contact etch stop layer 138 may separate an inter-layer dielectric layer 126 from the first transistor device 140, the second transistor device 142, and a boundary structure 150 (including the first boundary dielectric layer 108b, the second boundary dielectric layer 110b, the first polysilicon component 112, the second polysilicon component 114, and the hard mask component 116) within the boundary region 130. The contact etch stop layer 138 may have a 'U' shaped profile and line the first transistor device 140, the second transistor device 142, the boundary structure 150, and an upper surface of the substrate 106. The contact etch stop layer 138 may comprise a planar lateral component connecting a first vertical component abutting the sidewall spacer 146 arranged along a side of the structures within the boundary region 130 and a second vertical component abutting the sidewall spacer 146 arranged along a side of the first transistor device 140 or the second transistor device 142. Using the inter-layer dielectric layer 126 and the contact etch stop layer 138 to isolate the devices and structures allows for high device density to be achieved. It is appreciated by a person with ordinary skill in the art that though some device elements such as high-k gate dielectric, barrier layer, isolation regions, sidewall spacer, contact etch stop layer, and inter-layer dielectric layer are omitted in FIG.

1 for simplicity reason, these structures can be correspondingly incorporated in the embodiments of FIG. 1 in a similar way as shown in FIG. 2.

Further, similar to the embodiments of FIG. 1, in FIG. 2, the first boundary dielectric layer 108b and the second boundary dielectric layer 110b may contact each other and meet at an interface 128 within the boundary region 130. The first polysilicon component 112 may have a continuous top surface crossing over the interface 128 and comprising a convex portion 154 in the low voltage region 102 and a planar portion 156 in the high voltage region 104. The convex portion 154 and the planar portion 156 may have the substantially same lateral width. The second polysilicon component 114 can be disposed directly on the convex portion 154 of the first polysilicon component 112. The hard mask component 116 can be disposed neighbored to the second polysilicon component 114 directly on the planar portion 156 of the first polysilicon component 112. The second polysilicon component 114 and the hard mask component 116 can meet at an interface 152. In some embodiments, the interface 152 can be an extending line of the interface 128, while the interface 152 can be laterally shifted from an extending line of the interface 128 in some other embodiments. Top surfaces of the second poly silicon component 114 and the hard mask component 116 may be aligned, and may be further aligned to a top surface of the first gate electrode 118 or the second gate electrode 148. The first gate electrode 118 may have a thickness substantially equal to a collective thickness of the first polysilicon component 112 and the second polysilicon component 114. The second gate electrode 148 may have a thickness equal to a collective thickness of the first polysilicon component 112 and the hard mask component 116.

The sidewall spacer 146 and the contact etch stop layer 138 may have upper surfaces that are aligned with upper surfaces of the first gate electrodes 118, the second gate electrode 148, or the boundary structure 150. The high voltage region 104 and the low voltage region 102 may be laterally separated from one another by the inter-layer dielectric layer 126. In some embodiments, the inter-layer dielectric layer 126 may comprise a low-k dielectric layer, an ultra-low-k dielectric layer, an extreme low-k dielectric layer, and/or a silicon dioxide layer. Though not shown in FIG. 1 or FIG. 2, in some embodiments, one or more of the plurality of contacts may extend through the inter-layer dielectric layer 126 and be coupled to the source/drain regions. In some embodiments, the plurality of contacts may comprise a metal such as tungsten, copper, and/or aluminum.

FIGS. 3-17 illustrate a series of cross-sectional views 300-1700 of some embodiments of a method for manufacturing an IC comprising a boundary region defined between a low voltage region and a high voltage region.

Figure 3:
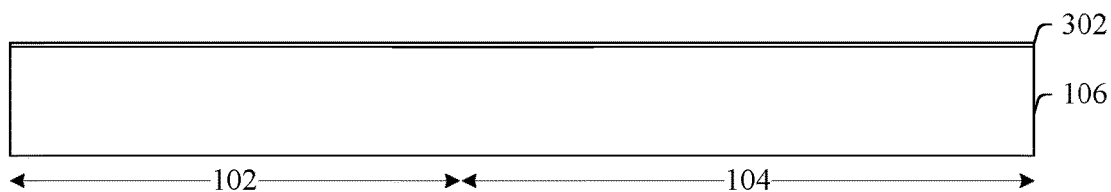
FIGS. 3-17 illustrate a series of cross-sectional views of some embodiments of a method for manufacturing an IC comprising a boundary region defined between a low voltage region and a high voltage region.

As shown in cross-sectional view 300 of FIG. 3, a substrate 106 is provided including a low voltage region 102 and a high voltage region 104. In various embodiments, the substrate 106 may comprise any type of semiconductor body (e.g., silicon bulk, SiGe, SOI, etc.) such as a semiconductor wafer or one or more die on a wafer, as well as any other type of semiconductor and/or epitaxial layers formed thereon and/or otherwise associated therewith. A dielectric layer 302 is formed on the substrate 106. The dielectric layer 302 can be an oxide layer, such as a silicon dioxide layer, but other suitable gate dielectric material is also applicable. The dielectric layer 302 may be formed by a thermal process, for example, by forming a silicon dioxide layer on a silicon substrate at high temperatures from 800° C.-1100° C. using a dry thermal growth method. The thickness of the dielectric layer 302 depends on applications, ranging from about several or tens of nanometers (nm) for current nodes to several angstroms (Å) for emerging nodes.

Figure 4:
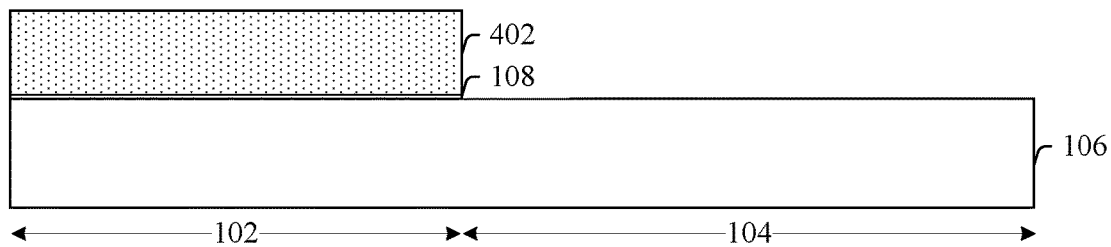

As shown in cross-sectional view 400 of FIG. 4, the dielectric layer 302 is patterned to be removed from the high voltage region 104. A mask layer 402 (e.g. a photoresist mask) can be formed over the dielectric layer 302 of FIG. 3 having openings corresponding to the high voltage region 104 to expose the dielectric layer 302 within the high voltage region 104 and to protect the dielectric layer 302 within the low voltage region 102 from a series of etching processes. In various embodiments, the etching processes may comprise a wet etch or a dry etch (e.g., a plasma etch with tetrafluoromethane (CF4), sulfur hexafluoride (SF6), nitrogen trifluoride (NF3), etc.). The mask layer 402 will be substantially removed after the etching processes. Thereby, a first precursor dielectric layer 108 is formed within the low voltage region 102.

Figure 5:
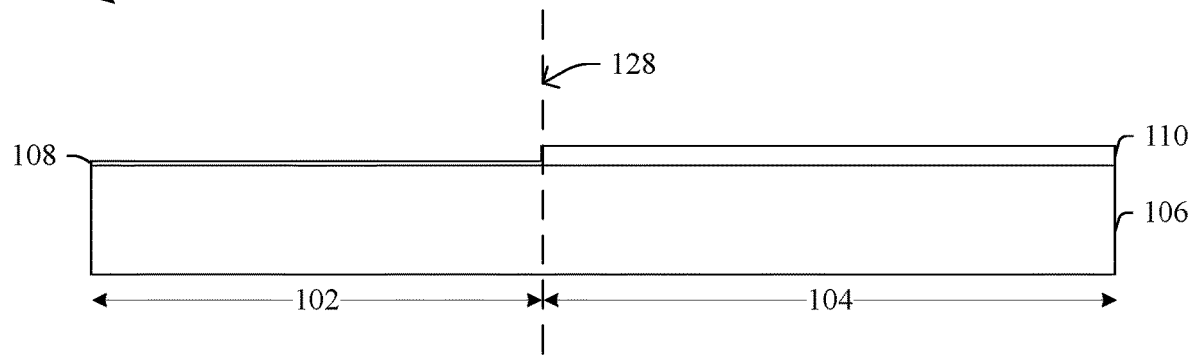

As shown in cross-sectional view 500 of FIG. 5, a second precursor dielectric layer 110 is formed within the high voltage region 104. Similar to forming the first precursor dielectric layer 108, the second precursor dielectric layer 110 can be an oxide layer and can be formed by a thermal process. The second precursor dielectric layer 110 can have a thickness greater than that of the first precursor dielectric layer 108. In some embodiments, the thickness of the second precursor dielectric layer 110 is about 2 to 5 times of a thickness of the first precursor dielectric layer 108. The second precursor dielectric layer 110 may be selectively grown on the substrate 106 within the high voltage region 104, as the low voltage region 102 is covered by the first precursor dielectric layer 108. In some embodiments, the first precursor dielectric layer 108 and the second precursor dielectric layer 110 meet at an interface 128. In some alternative embodiments, the second precursor dielectric layer 110 can be formed prior to forming the first precursor dielectric layer 108. The second precursor dielectric layer 110 can be formed by forming a dielectric layer over the substrate 106 followed by a patterning process to remove a portion within the low voltage region 102. And the first precursor dielectric layer 108 can be then selectively grown on the substrate 106 within the low voltage region 102.

Figure 6:
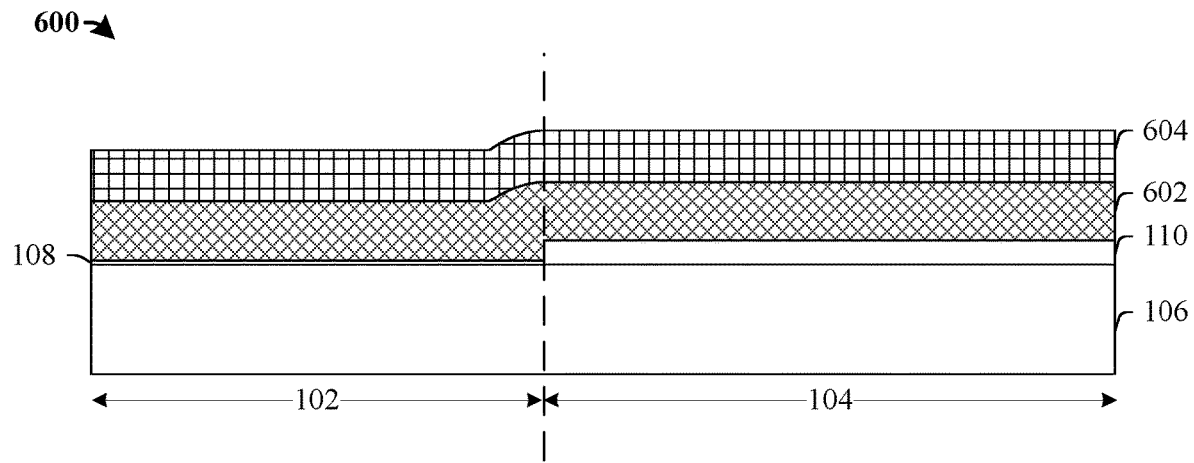

As shown in cross-sectional view 6 of FIG. 6, a first polysilicon layer 602 and a hard mask layer 604 are subsequently formed over the first precursor dielectric layer 108 and the second precursor dielectric layer 110 within both the low voltage region 102 and the high voltage region 104. In some embodiments, the hard mask layer 604 comprises silicon dioxide and/or silicon nitride, and the first polysilicon layer 602 comprises doped polysilicon. In some embodiments, the first polysilicon layer 602 and the hard mask layer 604 are formed by using a deposition technique (e.g., PVD, CVD, PE-CVD, ALD, etc.).

Figure 7:
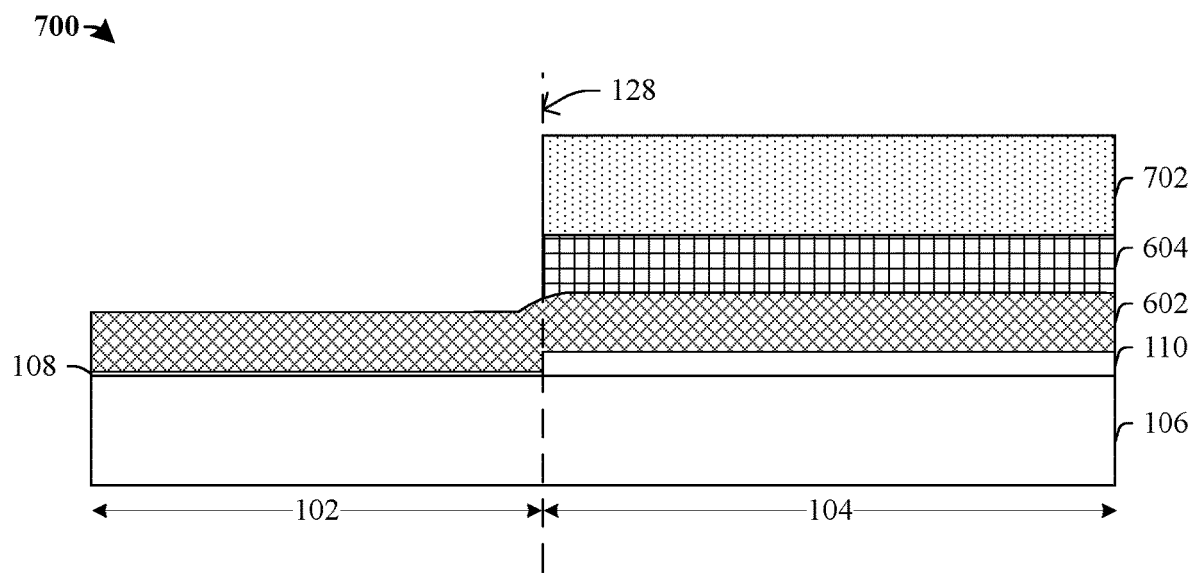

As shown in cross-sectional view 700 of FIG. 7, the hard mask layer 604 is patterned to be removed from the low voltage region 102 to expose an upper surface of the first polysilicon layer 602 within the low voltage region 102. A mask layer 702 (e.g. a photoresist mask) can be formed over the first polysilicon layer 602 having openings corresponding to the low voltage region 102 to expose the first polysilicon layer 602 within the low voltage region 102 and to protect the hard mask layer 604 within the high voltage region 104 from a series of etching processes. In various embodiments, the etching processes may comprise a wet etch or a dry etch (e.g., a plasma etch with tetrafluoromethane (CF4), sulfur hexafluoride (SF6), nitrogen trifluoride (NF3), etc.). The mask layer 702 will be substantially removed after the etching processes.

Figure 8:
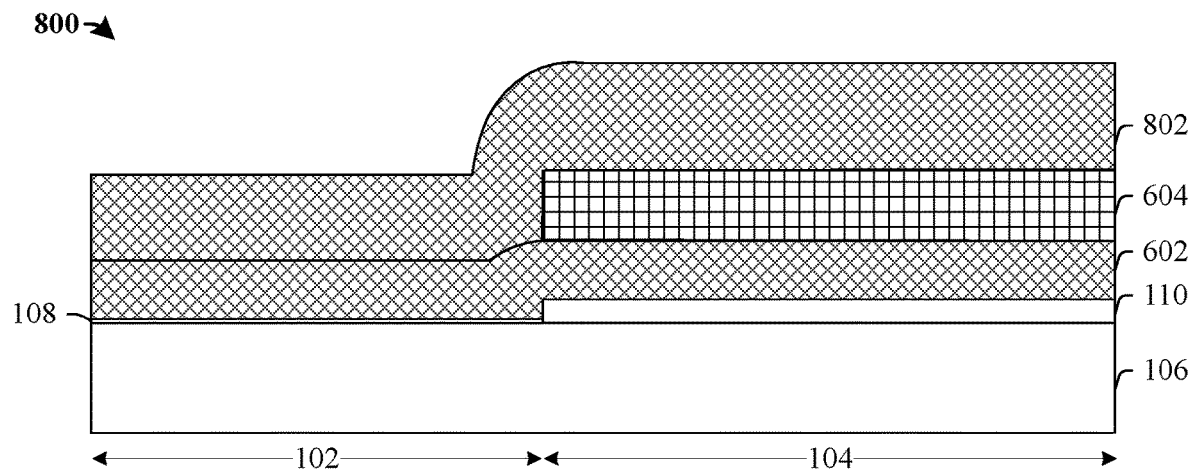

As shown in cross-sectional view 8 of FIG. 8, a second polysilicon layer 802 is formed on the first polysilicon layer 602 within the low voltage region 102 and on the hard mask layer 604 within the high voltage region 104. In some embodiments, the second polysilicon layer 802 comprises doped polysilicon. In some embodiments, the second polysilicon layer 802 is formed by using a deposition technique (e.g., PVD, CVD, PE-CVD, ALD, etc.).

Figure 9:
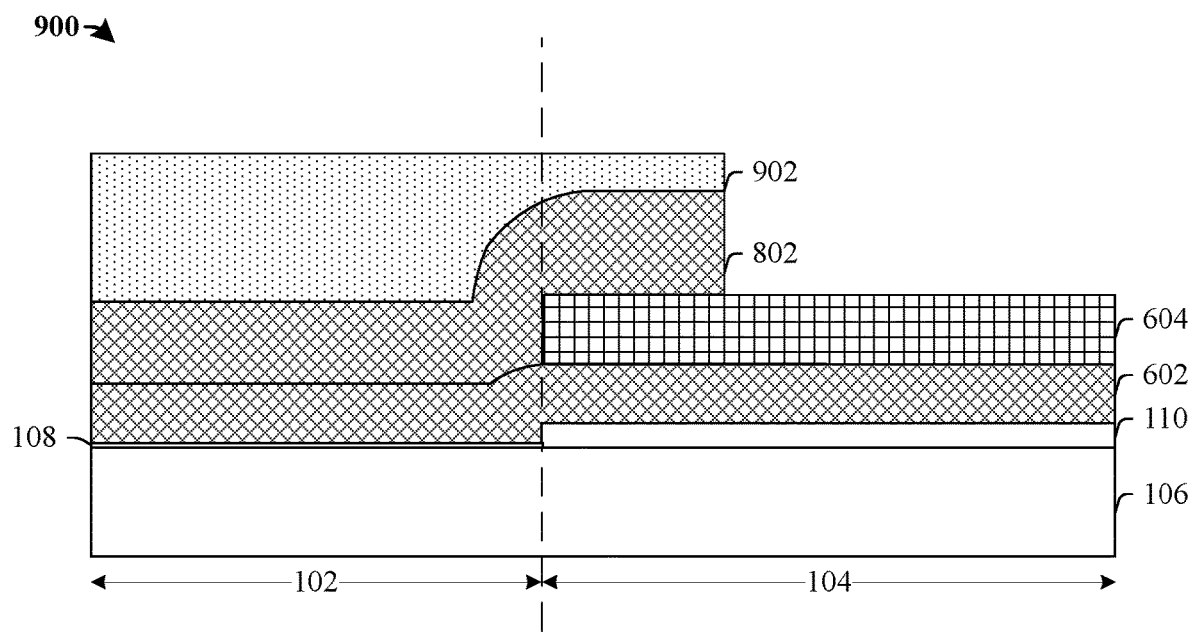

As shown in cross-sectional view 9 of FIG. 9, the second polysilicon layer 802 is patterned to be removed from a portion of the high voltage region 104 away from the low voltage region 102 to expose a portion of an upper surface of the hard mask layer 604. A mask layer 902 (e.g. a photoresist mask) can be formed over the second polysilicon layer 802 having openings corresponding to the portions of the second polysilicon layer 802 to be removed. The mask layer 902 will be substantially removed after the etching processes.

Figure 10:
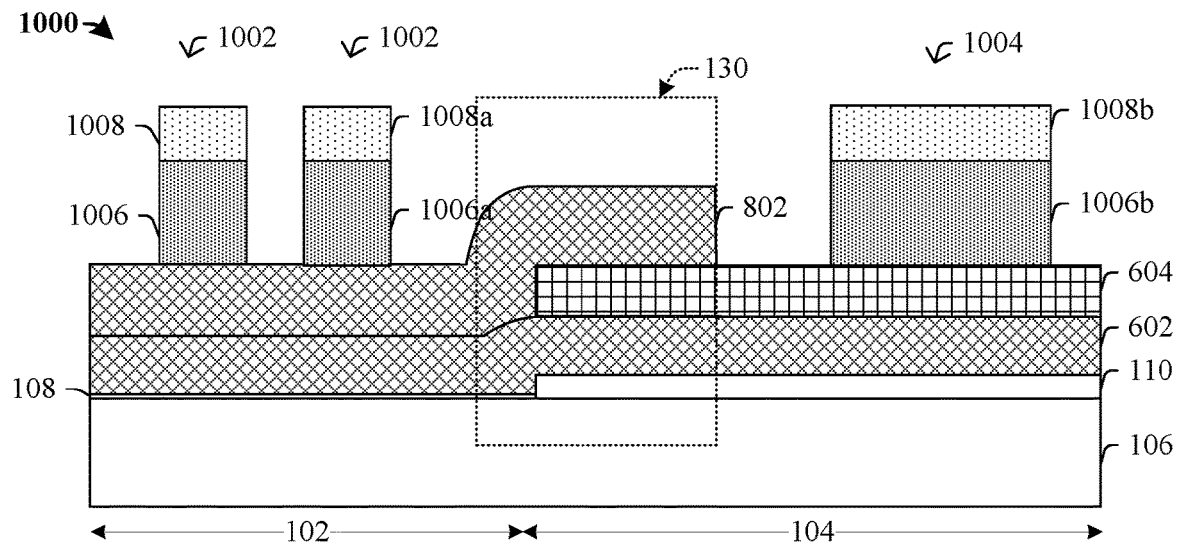

As shown in cross-sectional view 1000 of FIG. 10, a second hard mask layer 1006 is formed and patterned to form a first portion 1006a on the second polysilicon layer 802 within the low voltage region 102 and a second portion 1006b on the hard mask layer 604 within the boundary region 130. In some embodiments, the second hard mask layer 1006 is formed by a deposition process. The first portion 1006a and the second portion 1006b may have the substantially same height relative to the substrate 106, i.e., top surfaces of the first portion 1006a and the second portion 1006b of the second hard mask layer 1006 may be substantially aligned.

Figure 11:
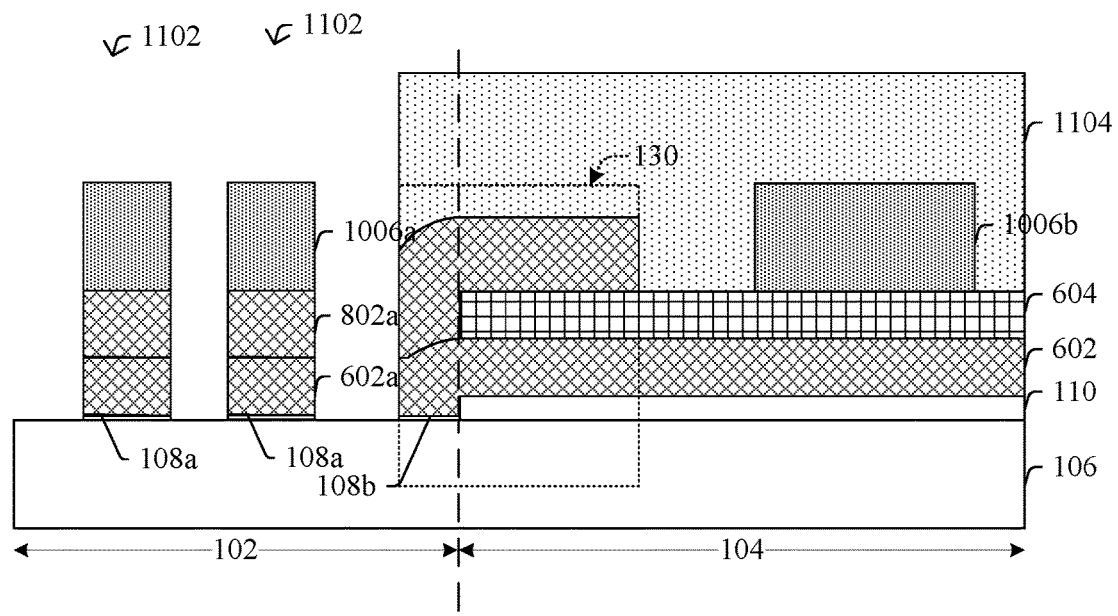

As shown in cross-sectional view 11 of FIG. 11, the first polysilicon layer 602 and the second polysilicon layer 802 are patterned together and to be removed from a portion of the low voltage region 102 to expose a portion of an upper surface of the first precursor dielectric layer 108, and to form a first sacrificial gate stack 1102. A mask layer 1104 (e.g. a photoresist mask) can be formed as shown in FIG. 11 for the patterning process. The first portion 1006a of the second hard mask layer 1006 is also used for the patterning process to form the first sacrificial gate stack 1102 within the low voltage region 102. A portion 602a of the first polysilicon layer 602 and a portion 802a of the second polysilicon layer 802 are kept as components of the first sacrificial gate stack 1102. In some embodiments, the first precursor dielectric layer 108 is then patterned according to the first sacrificial gate stack 1102 and the mask layer 1104 or the structure underneath the mask layer 1104 to form a first gate dielectric layer 108a and a first boundary dielectric layer 108b. The first gate dielectric layer 108a and the first boundary dielectric layer 108b are spaced one from another. Though not shown in the process figures, source/drain regions can be formed within the substrate 106 alongside the first sacrificial gate stack 1102. Examples of the source/drain regions can be referred to the source/drain regions of FIG. 1 and FIG. 2.

Figure 12:
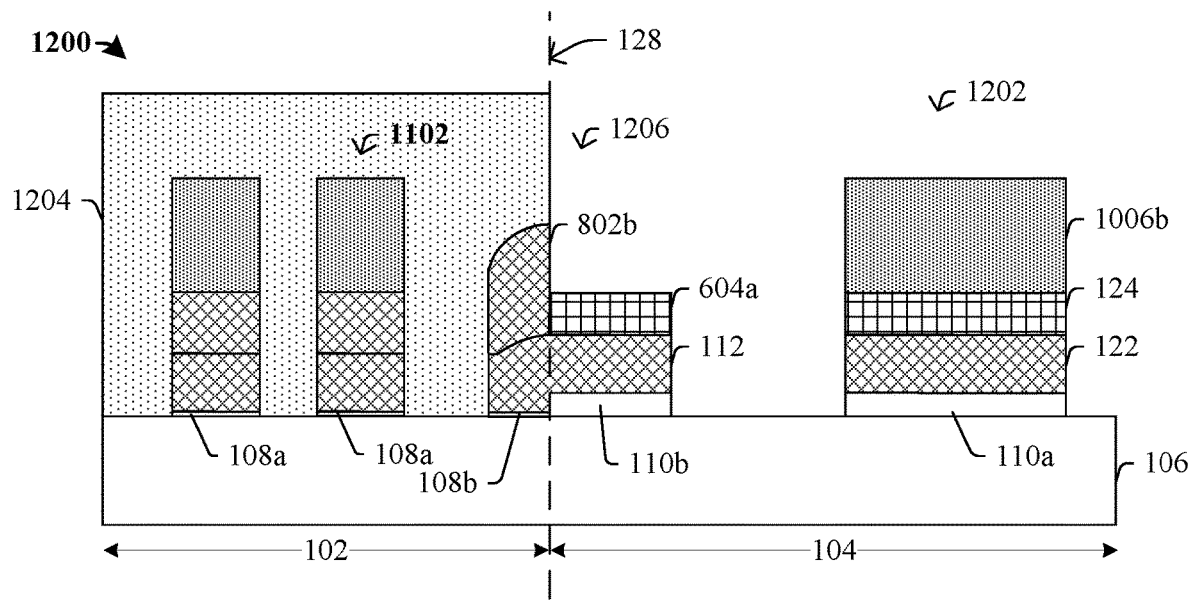

As shown in cross-sectional view 12 of FIG. 12, the first polysilicon layer 602 is patterned to be removed from a portion of the high voltage region 104 according to the second portion 1006b of the second hard mask layer 1006 to form a second gate stack 1202 within the high voltage region 104. A portion 802b of the second polysilicon layer 802 within the boundary region 130 is protected by a mask layer 1204 (e.g. a photoresist mask). The mask layer 1204 will be substantially removed after the etching processes. In some embodiments, a first polysilicon component 112 of the first polysilicon layer 602 is protected by the portion 802b of the second polysilicon layer 802 and a portion 604a of the hard mask layer 604. The patterning process forms a second gate electrode 122 and a hard mask 124 directly under the second portion 1006b of the second hard mask layer 1006. In some embodiments, the second precursor dielectric layer 110 is then patterned according to the second sacrificial gate stack 1202 and the portion 604a of the hard mask layer 604 or the first polysilicon component 112 underneath the portion 604a to form a second gate dielectric layer 110a and a second boundary dielectric layer 110b. The second gate dielectric layer 110a and the second boundary dielectric layer 110b are spaced one from another. Though not shown in the process figures, source/drain regions can be formed within the substrate 106 alongside the second sacrificial gate stack 1202. Examples of the source/drain regions can be referred to the source/drain regions of FIG. 1 and FIG. 2. A boundary stack 1206 is formed comprising the first boundary dielectric layer 108b, the second boundary dielectric layer 110b, the first polysilicon component 112, the portion 604a of the hard mask layer 604, and the portion 802a of the second polysilicon layer 802. Outer sidewalls of the first boundary dielectric layer 108b and the second boundary dielectric layer 110b can be respectively aligned with those of the boundary stack 1206. A sidewall spacer (e.g. 146 in FIG. 2) can be formed along sidewalls of the first sacrificial gate stack 1102, the second gate stack 1202, and the boundary stack 1206. The sidewall spacer may comprise one or more layers of oxide or nitride. The source/drain regions (e.g. 125, 127, 129 in FIG. 2) are formed between opposing sides of the first sacrificial gate stack 1102 and the second gate stack 1202 within the substrate 106. In some embodiments, the source/drain regions may be formed by an implantation process that selectively implants the substrate 106 with a dopant, such as boron (B) or phosphorous (P), for example. In some other embodiments, the source/drain regions may be formed by performing an etch process to form a trench followed by an epitaxial growth process. In such embodiments, the source/drain regions may have a raised portion that is higher than the upper surface of the substrate 106. In some embodiments, a salicidation process is performed to form a silicide layer (not shown in the figure) on upper surfaces of the source/drain regions. In some embodiments, the salicidation process may be performed by depositing a nickel layer and then performing a thermal annealing process (e.g., a rapid thermal anneal). A contact etch stop layer (138 in FIG. 2) may be then subsequently formed lining sidewalls of the sidewall spacer (i.e., along the first sacrificial gate stack 1102, the second gate stack 1202, and the boundary stack 1206). The contact etch stop layer may comprise silicon nitride formed by way of a deposition process (e.g., CVD, PVD, etc.). An inter-layer dielectric layer 126 is then formed between and over the first sacrificial gate stack 1102, the second gate stack 1202, and the boundary stack 1206. The inter-layer dielectric layer 126 may comprise a low-k dielectric layer, formed by way of a deposition process (e.g., CVD, PVD, etc.).

Figure 13:
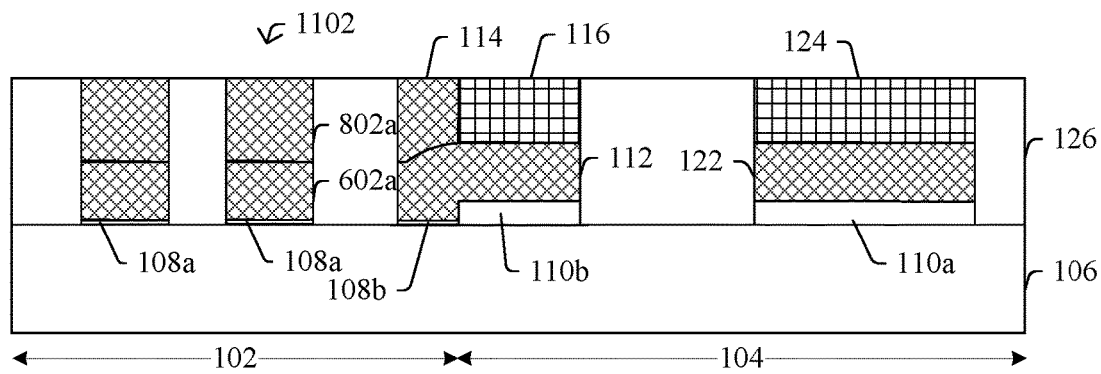

As shown in cross-sectional view 13 of FIG. 13, a planarization process is performed to from a second polysilicon component 114 of the second polysilicon layer 802 (e.g. shown in FIG. 10) and a hard mask component 116 of the hard mask layer 604 (e.g. shown in FIG. 10). The patterning process results in substantially planar and aligned top surfaces of the first sacrificial gate stack 1102 within the low voltage region 102, the second polysilicon component 114 and the hard mask component 116 within the boundary region 130, and the hard mask 124 within the high voltage region 104. The planarization process may comprise a chemical mechanical polishing (CMP) process. The first sacrificial gate stack 1102 may be exposed after the planarization process.

Figure 14:
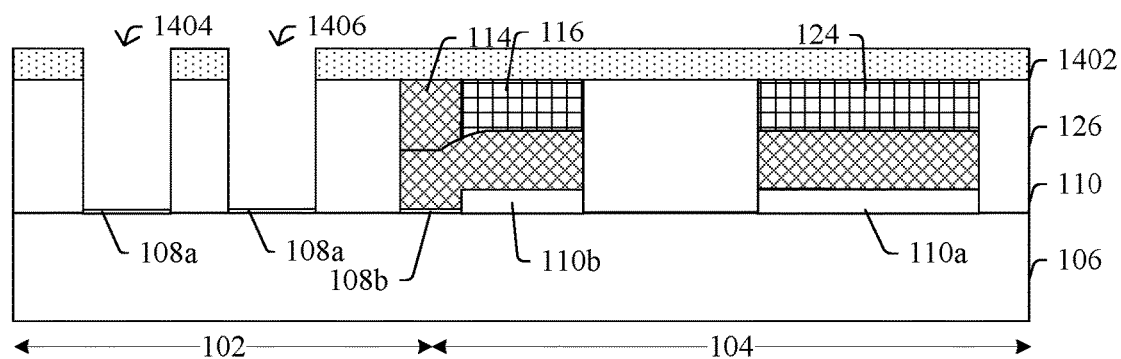

As shown in cross-sectional view 14 of FIG. 14, a third hard mask layer 1402 is formed over the inter-layer dielectric layer 126, the first sacrificial gate stack 1102, the second gate stack 1202, and the boundary stack 1206 and patterned to expose the first sacrificial gate stack 1102 within the low voltage region 102. The first sacrificial gate stack 1102 is then removed, resulting in the formation of trenches 1404, 1406.

Figure 15:
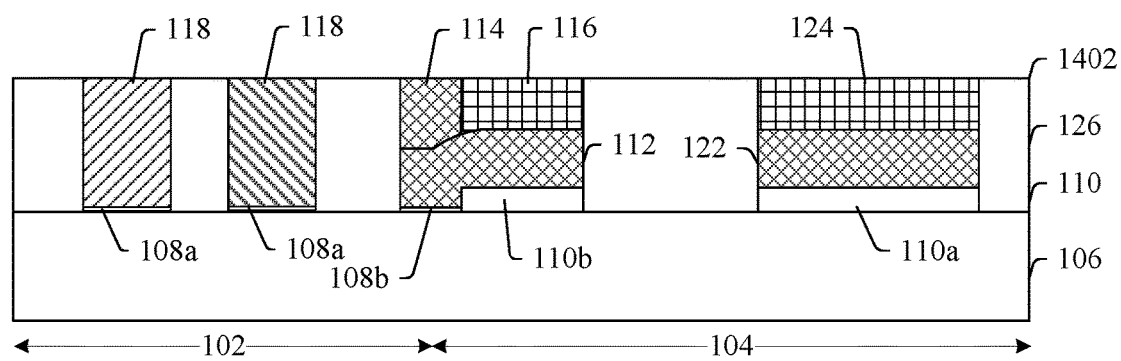

As shown in cross-sectional view 1500 of FIG. 15, metal gate materials are filled into the trenches 1404, 1406 of FIG. 14 to form a first gate electrode 118. The first gate electrode 118 is filled into the trenches 1404, 1406 of FIG. 14 through one or more deposition processes (e.g., chemical vapor deposition, physical vapor deposition, etc.). A barrier layer can be formed in conformal surround core metal materials and comprise metal materials such as titanium (Ti), tantalum (Ta), zirconium (Zr), or their alloys, for example. A series of deposition and etching processes can be performed that form different metal compositions within the trenches 1404, 1406 for different devices or different components of the same devices, to achieve desired work functions. Contacts can be formed within and overlying the inter-layer dielectric layer 126. The contacts may be formed by selectively etching the inter-layer dielectric layer 126 to form openings (e.g. with a patterned photoresist mask in place), and by subsequently depositing a conductive material within the openings. In some embodiments, the conductive material may comprise tungsten (W) or titanium nitride (TiN), for example. In some alternative embodiments, the second gate dielectric layer 110a and the hard mask 124 can be replaced with a second metal gate (e.g. referring to the second gate electrode 148 shown in FIG. 2) by a series of fabrication process similar to what is described above in FIG. 14 and FIG. 15. In some further embodiments, the first gate electrode 118 and the second metal gate (e.g. the second gate electrode 148 shown in FIG. 2) can be respectively formed within the low voltage region 102 and the high voltage region 104. The first gate electrode 118 and the second metal gate (e.g. the second gate electrode 148 shown in FIG. 2) can be formed by one replacement gate process, or by separate replacement gate processes.

Figure 16:
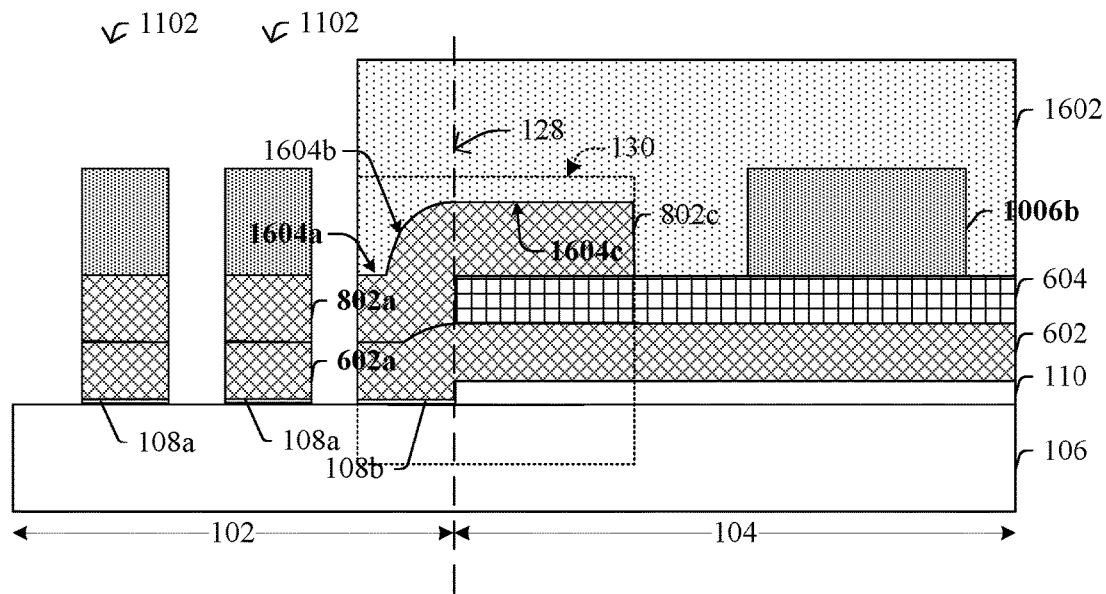
Figure 17:
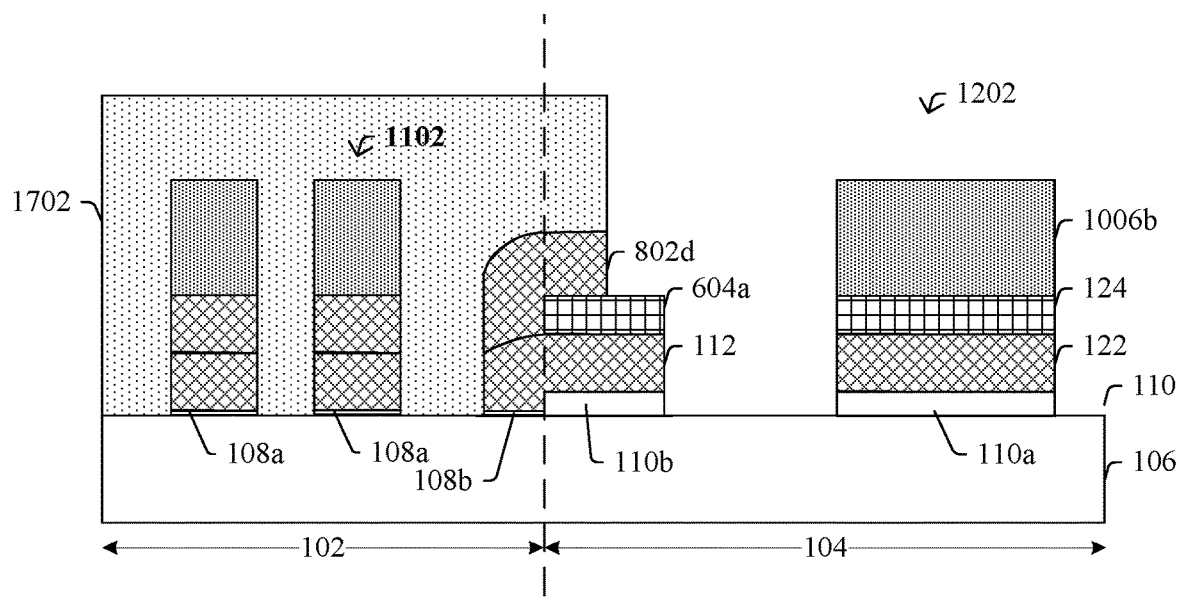

FIG. 16 and FIG. 17 shows some alternative embodiments of the method for manufacturing an IC comprising a boundary region defined between a low voltage region and a high voltage region. As an alternative processing step of FIG. 11, as shown in FIG. 16, the boundary region 130 can be wider than what is shown in FIG. 11. The second polysilicon layer 802 is patterned according to an alternative mask layer 1602, such that a portion 802c of the second polysilicon layer 802 is patterned and formed to have a top surface including a lower planar portion 1604a and an upper planar portion 1604c connected by a convex curved portion 1604b. The lower planar portion 1604a may have a smaller, equal, or greater height than that of the hard mask layer 604, resulting different top surface topologies of the portion 802c of the second polysilicon layer 802, which can be appreciated in a similar way as shown by FIG. 11-15. As an alternative processing step of FIG. 12, as shown in FIG. 17, the second polysilicon layer 802 can be patterned according to a mask layer 1702 alternative to the mask layer 1204 in FIG. 12, such that a portion 802d of the second polysilicon layer 802 is patterned and formed to overly a portion of a hard mask layer portion 604a. The portion 802d of the second polysilicon layer 802 has a top surface including an upper planar portion and a convex curved portion. These alternative approaches may result in different top surface topologies portions of the second polysilicon layer 802, which can be appreciated in a similar way as shown by FIG. 11-15.

Figure 18:
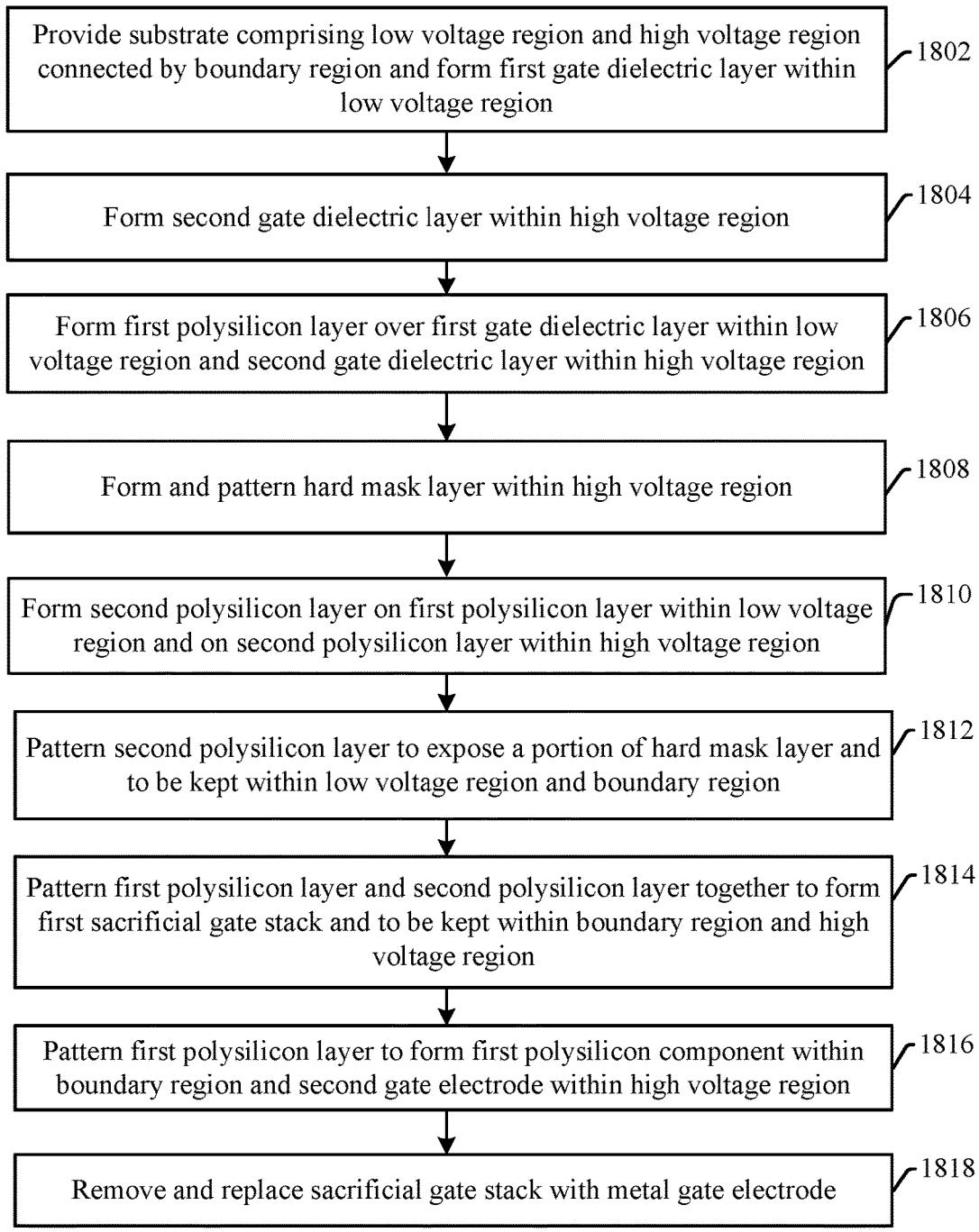
FIG. 18 illustrates a flow diagram of some embodiments of a method for manufacturing an IC comprising a boundary region defined between a low voltage region and a high voltage region.

FIG. 18 illustrates a flow diagram of some embodiments of a method 1800 for manufacturing an IC comprising a boundary region defined between a low voltage region and a high voltage region.

Although method 1800 is described in relation to FIGS. 3-15, it will be appreciated that the method 1800 is not limited to such structures, but instead may stand alone as a method independent of the structures. Furthermore, while the disclosed methods (e.g., method 1800) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1802, a substrate is provided including a low voltage region and a high voltage region. A dielectric layer is formed on the substrate. The dielectric layer is then patterned to be removed from the high voltage region and to form a first precursor dielectric layer. FIGS. 3-4 illustrate some embodiments of cross-sectional views 300, 400 corresponding to act 1802.

At 1804, a second precursor dielectric layer is formed within the high voltage region. The second precursor dielectric layer may be formed by a thermal process. FIG. 5 illustrates some embodiments of a cross-sectional view 500 corresponding to act 1804.

At 1806, a first polysilicon layer and a hard mask layer are subsequently formed over the first precursor dielectric layer and the second precursor dielectric layer within both the low voltage region and the high voltage region. FIG. 6 illustrates some embodiments of a cross-sectional view 600 corresponding to act 1806.

At 1808, the hard mask layer is patterned to be removed from the low voltage region to expose an upper surface of the first polysilicon layer within the low voltage region. FIG. 7 illustrates some embodiments of a cross-sectional view 700 corresponding to act 1808.

At 1810, a second polysilicon layer is formed on the first polysilicon layer within the low voltage region and on the hard mask layer within the high voltage region. FIG. 8 illustrates some embodiments of a cross-sectional view 800 corresponding to act 1810.

At 1812, the second polysilicon layer is patterned to be removed from a portion of the high voltage region away to expose a portion of an upper surface of the hard mask layer. FIG. 9 illustrates some embodiments of a cross-sectional view 900 corresponding to act 1812.

At 1814, the first polysilicon layer and the second polysilicon layer are patterned together to form a first sacrificial gate stack. The first polysilicon layer and the second polysilicon layer are removed from a portion of the low voltage region to expose a portion of an upper surface of the first precursor dielectric layer. The first sacrificial gate stack is formed by patterning a second hard mask layer to form a first portion on the second polysilicon layer within the low voltage region and a second portion on the hard mask layer within the boundary region. FIGS. 10-11 illustrate some embodiments of cross-sectional views 1000, 1100 corresponding to act 1814.

At 1816, the first polysilicon layer is patterned to form a first polysilicon component within the boundary region and a second gate electrode within the high voltage region. FIGS. 12-13 illustrate some embodiments of cross-sectional views 1200, 1300 corresponding to act 1816.

At 1818, a replacement gate process is subsequently performed by forming metal materials within the formed trenches. FIGS. 14-15 illustrate some embodiments of cross-sectional views 1400, 1500 corresponding to act 1818.

Therefore, the present disclosure relates to an integrated circuit (IC) that a boundary structure of a boundary region defined between a low voltage region and a high voltage region, and a method of formation and that provides small scale and high performance, and a method of formation.

In some embodiments, the present disclosure relates to an integrated circuit. The integrated circuit comprises a low voltage region, a high voltage region, and a boundary region defined between the low voltage region and the high voltage region. A first boundary dielectric layer is disposed over a substrate in the low voltage region. A second boundary dielectric layer is disposed over the substrate in the high voltage region having a thickness greater than that of the first boundary dielectric layer. The first boundary dielectric layer meets the second boundary dielectric layer at the boundary region. A first polysilicon component is disposed within the boundary region over the first boundary dielectric layer and the second gate boundary layer. A second polysilicon component is disposed within the boundary region over the first polysilicon component. A hard mask component is disposed within the boundary region over the first polysilicon component and laterally neighbored to the second polysilicon component.

In other embodiments, the present disclosure relates to an integrated circuit. The integrated circuit comprises a low voltage region comprising a first transistor device having a first gate electrode disposed over a first gate dielectric layer. A high voltage region comprises a second transistor device having a second gate electrode disposed over a second gate dielectric layer that has a thickness greater than that of the first gate dielectric layer. The second transistor configured to operate at an operation voltage greater than that of the first transistor. A boundary structure is disposed within a boundary region defined between the low voltage region and the high voltage region. The boundary structure comprises a first polysilicon component, a second polysilicon component disposed over the first polysilicon component, and a hard mask component disposed laterally neighbored to the second polysilicon component and over the first polysilicon component.

In yet other embodiments, the present disclosure relates to a method of forming an integrated circuit. The method comprises providing a substrate comprising a low voltage region, a high voltage region, and a boundary region defined between the low voltage region and the high voltage region. The method further comprises forming a first gate precursor dielectric layer within the low voltage region and a second gate precursor dielectric layer within the high voltage region, wherein the second precursor dielectric layer has a thickness greater than that of the first precursor dielectric layer. The method further comprises forming a first polysilicon layer over the first precursor gate dielectric layer within the low voltage region and a second precursor gate dielectric layer within the high voltage region. The method further comprises forming and patterning a hard mask layer within the high voltage region. The method further comprises forming a second polysilicon layer directly on the first polysilicon layer within the low voltage region and directly on the second polysilicon layer within the high voltage region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC), comprising:
a low voltage region, a high voltage region, and a boundary region defined between the low voltage region and the high voltage region;
a first boundary dielectric layer disposed over a substrate in the low voltage region;
a second boundary dielectric layer disposed over the substrate in the high voltage region having a thickness greater than that of the first boundary dielectric layer, wherein the first boundary dielectric layer meets the second boundary dielectric layer at an interface in the boundary region;
a first polysilicon component disposed within the boundary region extending continuously over the first boundary dielectric layer and the second boundary dielectric layer;
a second polysilicon component disposed over the first polysilicon component on one side of the interface closer to the low voltage region; and
a hard mask component disposed directly on a top surface of the first polysilicon component on another side of the interface opposite to the second polysilicon component and closer to the high voltage region.

2. The IC of claim 1, further comprising:
a first transistor device disposed within the low voltage region and has a first gate electrode disposed over a first gate dielectric layer;
wherein the first gate electrode has a thickness substantially equal to a collective thickness of the first polysilicon component and the second polysilicon component.

3. The IC of claim 2, wherein the first gate electrode comprises a metal gate electrode having its sidewall and bottom surfaces covered by a high-k dielectric layer.

4. The IC of claim 2, further comprising:
a second transistor device disposed within the high voltage region and has a second gate electrode disposed over a second gate dielectric layer, the second transistor device configured to operate at an operation voltage greater than that of the first transistor device.

5. The IC of claim 4, wherein the second gate electrode has a thickness equal to that of the first polysilicon component.

6. The IC of claim 4, further comprising:
a hard mask disposed directly on the second gate electrode within the high voltage region, the hard mask having the same composition as the hard mask component within the boundary region.

7. The IC of claim 6, wherein top surfaces of the hard mask and the hard mask component are substantially coplanar.

8. The IC of claim 1, wherein the hard mask component and the second polysilicon component meet at an extending line of the interface where the first boundary dielectric layer and the second boundary dielectric layer meet.

9. The IC of claim 1, wherein the hard mask component and the second polysilicon component have aligned upper surfaces.

10. An integrated circuit (IC), comprising:
a low voltage region comprising a first transistor device having a first gate electrode disposed over a first gate dielectric layer;
a high voltage region comprising a second transistor device having a second gate electrode disposed over a second gate dielectric layer that has a thickness greater than that of the first gate dielectric layer, the second transistor device configured to operate at an operation voltage greater than that of the first transistor device; and
a boundary structure disposed within a boundary region defined between the low voltage region and the high voltage region, wherein the boundary structure comprises a first polysilicon component, a second polysilicon component disposed over the first polysilicon component, and a hard mask component disposed laterally neighbored to the second polysilicon component and over the first polysilicon component;
wherein the first polysilicon component of the boundary structure is disposed directly on a first boundary dielectric layer within the low voltage region and a second boundary dielectric layer within the high voltage region;
wherein the hard mask component and the second polysilicon component have planar upper surfaces aligned with an upper surface of the second gate electrode.

11. The IC of claim 10, wherein the first boundary dielectric layer and the second boundary dielectric layer meet at an interface within the boundary region, wherein the hard mask component and the second polysilicon component meet at an extending line of the interface.

12. The IC of claim 10, wherein the hard mask component and the second polysilicon component have planar upper surfaces aligned with an upper surface of the first gate electrode.

13. The IC of claim 10, wherein the first gate dielectric layer and the second polysilicon component have sidewall surfaces aligned with one another.

14. The IC of claim 10, wherein a top surface of the first polysilicon component comprises a convex curved portion within the low voltage region and a planar portion within the high voltage region.

15. The IC of claim 10, wherein the hard mask component has an outermost sidewall directly contacting an outermost sidewall of the second polysilicon component.

16. The IC of claim 10, wherein the first gate dielectric layer is disposed directly abutting the first polysilicon component and an upper surface of a substrate within the boundary region.

17. The IC of claim 10, wherein the first polysilicon component of the boundary structure is disposed on top surfaces of the first boundary dielectric layer and the second boundary dielectric layer.

18. An integrated circuit (IC), comprising:
a low voltage region comprising a first transistor device disposed over a substrate and having a first gate electrode disposed over a first gate dielectric layer, and wherein the first gate electrode comprises a metal gate electrode having its sidewall and bottom surfaces covered by a high-k dielectric layer;
a high voltage region disposed over the substrate and comprising a second transistor device having a second gate electrode disposed over a second gate dielectric layer, wherein the second gate dielectric layer has a thickness greater than that of the first gate dielectric layer, and wherein the second transistor device is configured to operate at an operation voltage greater than that of the first transistor device;
a boundary structure disposed within a boundary region defined between the low voltage region and the high voltage region, wherein the boundary structure comprises a first polysilicon component disposed over the substrate, a second polysilicon component disposed directly on the first polysilicon component, and a hard mask component disposed laterally neighbored to the second polysilicon component and directly on the first polysilicon component; and
an inter-layer dielectric layer disposed between the first transistor device and the boundary structure and between the second transistor device and the boundary structure;
wherein the second polysilicon component and the hard mask component have top surfaces aligned one another.

19. The IC of claim 18, further comprising:
a contact etch stop layer separating the inter-layer dielectric layer from the first transistor device, the second transistor device and the boundary structure, wherein the contact etch stop layer is 'U' shaped having a first vertical portion contacting the boundary structure and a second vertical portion contacting the first transistor device or the second transistor device, wherein the first vertical portion and the second vertical portion are connected by a continuous lateral portion.

20. The IC of claim 18, wherein the first gate dielectric layer is disposed directly on the substrate, and wherein the second gate dielectric layer is disposed directly on the substrate.

* * * * *